United States Patent
Minet et al.

(10) Patent No.: US 10,317,288 B2
(45) Date of Patent: Jun. 11, 2019

(54) METHOD FOR MEASURING THE FREQUENCY MODULATION OF A LASER SOURCE

(71) Applicant: THALES, Courbevoie (FR)

(72) Inventors: Jean Minet, Palaiseau (FR); Grégoire Pillet, Palaiseau (FR); Patrick Feneyrou, Palaiseau (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/561,057

(22) PCT Filed: Mar. 16, 2016

(86) PCT No.: PCT/EP2016/055639
§ 371 (c)(1),
(2) Date: Sep. 24, 2017

(87) PCT Pub. No.: WO2016/150783
PCT Pub. Date: Sep. 29, 2016

(65) Prior Publication Data
US 2018/0073932 A1    Mar. 15, 2018

(30) Foreign Application Priority Data

Mar. 26, 2015  (FR) .................................... 15 00603

(51) Int. Cl.
*G01J 9/04*    (2006.01)
*G01S 7/497*   (2006.01)
(Continued)

(52) U.S. Cl.
CPC ................ *G01J 9/04* (2013.01); *G01S 7/497* (2013.01); *G01S 7/4911* (2013.01);
(Continued)

(58) Field of Classification Search
CPC ...................................... G01J 9/04; G01J 9/02
See application file for complete search history.

(56) References Cited

U.S. PATENT DOCUMENTS

| | | | | |
|---|---|---|---|---|
| 5,808,743 A | * | 9/1998 | Stephens | G01H 9/00 356/614 |
| 2008/0317075 A1 | * | 12/2008 | Vanier | G04F 5/145 372/28 |
| 2011/0051763 A1 | * | 3/2011 | Vanier | G04F 5/145 372/38.02 |

OTHER PUBLICATIONS

B. Nowakowski et al., "Development of a Miniature, Multichannel, Extended-Range Fabry-Perot Fiber-Optic Laser Interferometer System for Low Frequency SI-Traceable Displacement Measurement," Nov. 1, 2014, XP055246904.

(Continued)

*Primary Examiner* — Jonathan M Hansen
(74) *Attorney, Agent, or Firm* — Baker & Hostetler LLP

(57) ABSTRACT

A method for reducing the peak factor of a signal transmitted in a frequency band comprising several channels, the signal using a plurality of channels in the band comprises: a step of clipping the signal, a step of subtracting the clipped signal from the signal, so as to obtain a peak signal, a step of filtering the peak signal with the aid of a multichannel filter configured to comply with a predetermined spectral mask for each of the channels used by the signal, and a step of subtracting the filtered peak signal from the signal. A device for emitting a multichannel signal implementing the method for reducing the peak factor is also provided.

13 Claims, 6 Drawing Sheets

(51) Int. Cl.
  *G01S 17/32* (2006.01)
  *G01S 7/491* (2006.01)
  *H01S 5/00* (2006.01)
  *H01S 5/062* (2006.01)
(52) U.S. Cl.
  CPC .......... *G01S 17/325* (2013.01); *H01S 5/0014* (2013.01); *H01S 5/0622* (2013.01)

(56) References Cited

OTHER PUBLICATIONS

T. Schwarze et al., "Advanced phasemeter for deep phase modulation interferometry," Optics Express, vol. 22, No. 15, Jul. 21, 2014, pp. 18214, XP055246228.

* cited by examiner

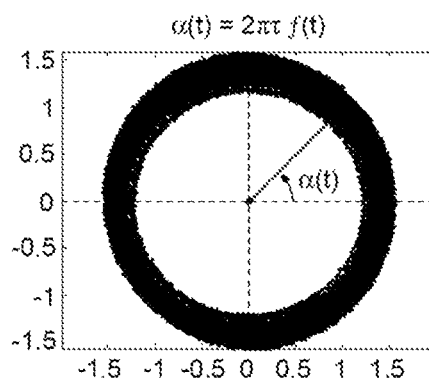
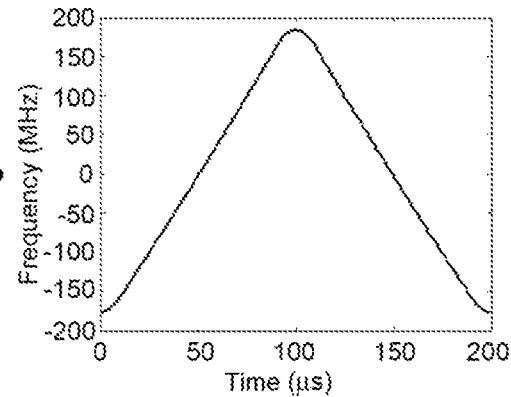
FIG.4b
FIG.4c
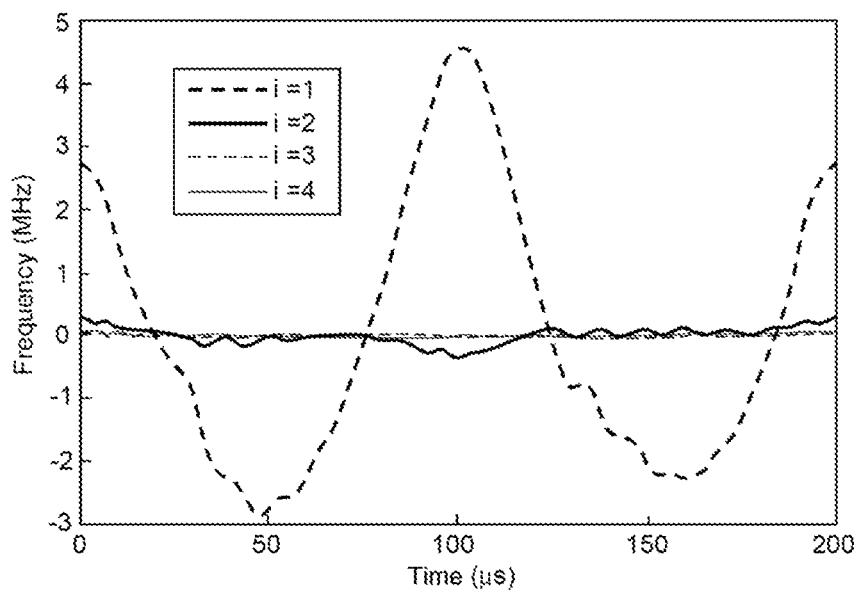
FIG.6

METHOD FOR MEASURING THE FREQUENCY MODULATION OF A LASER SOURCE

CROSS-REFERENCE TO RELATED APPLICATIONS

This application is a National Stage of International patent application PCT/EP2016/055639, filed on Mar. 16, 2016, which claims priority to foreign French patent application No. FR 1500603, filed on Mar. 26, 2015, the disclosures of which are incorporated by reference in their entirety.

FIELD OF THE INVENTION

The field of the invention is that of the measurement and possibly of the control of the frequency modulation of a laser source.

BACKGROUND

Up to now, the measurement of the frequency modulation of a laser source was most often achieved using a Michelson or Mach-Zehnder interferometer one of the two arms of which included an acousto-optical modulator. An example of a system of this type is shown in FIG. 1a. It comprises:
- a laser source 1, with a controller 11 of a modulation voltage corresponding to a frequency setpoint $f_0(t)$, said controller being equipped with a unit 111 for storing digital setpoints and a converter 112 for converting these digital setpoints into analog signals $f_0(t)$;
- a coupler 12 that samples some of the light emitted in order to send it to an interferometer 2;
- a two-arm Mach-Zehnder interferometer 2 with, in one arm, a delay line 21 and, in the other, an acousto-optical modulator (or "AOM") 22 itself associated with an RF generator 221, and two couplers, one 23 allowing splitting, preferably into two equal portions, and the other 24 allowing light that has passed through the two arms to be recombined;
- a photodiode 3 able to convert the light-intensity signal of a beat generated by the interferometer into an analog electrical signal;
- a device 4 for measuring the signals delivered by the photodiode 3, which includes a converter 41 for converting these analog signals into digital signals, a converter 42 for converting the analog signals of the generator into digital signals and reciprocally connected to the generator 221, and a unit 43 for storing, at preset times, digital signals generated by the converters 41 and 42;
- a unit 5 for processing the stored signals, and transmitting a set voltage to the controller 11; and
- a synchronizing device 6 between the storing unit 43, the acousto-optical modulator 22 (via the converter 42 and the generator 221) and the voltage controller 11.

The frequency is determined by analyzing the signal output from the interferometer; it is a question of a beat signal between the two signals respectively emerging from the two arms.

The signal measured by the photodiode (excluding any DC component) is then:

$$x(t) \propto \cos(\varphi(t) - \varphi(t-\tau) + 2\pi f_{mao} t)$$

where $\varphi(t)$ is the phase of the laser source, where $f_{mao}$ is the frequency of the acousto-optical modulator and $\tau$ is the delay induced by the optical fiber and corresponding to the path difference between the two arms of the Mach-Zehnder interferometer 2. The phase difference $\varphi(t) - \varphi(t-\tau)$ is characteristic of the frequency $f(t)$ of the laser according to the following relationship:

$$\varphi(t) - \varphi(t-\tau) = 2\pi \int_{t-\tau}^{t} f(t) dt \approx 2\pi \tau f(t) \qquad (1).$$

To evaluate the frequency of the laser, it is therefore advisable to calculate:

$$x(t) \cdot \exp(-2i\pi f_{mao} t)$$

then to apply a low-pass filter of cut-off frequency lower than $f_{mao}$. $z(t)$ is then found such that:

$$z(t) \propto \exp(i\varphi(t) - i\varphi(t-\tau)).$$

The evaluation of the complex argument of $z(t)$ then finally allows the frequency of the laser to be deduced according to equation (1).

This method relies on the frequency translation induced by the acousto-optical modulator.

Acousto-optical modulators are components that are liable to directly penalize the size, weight, electrical power consumption, reliability and cost of the systems in which they are used. These penalties may also be indirect. For example, it may be necessary to electromagnetically shield the detection chain because of interference caused by the acousto-optical modulator. In addition, it may also be noted that working at high intermediate frequencies requires a more complex detection chain to be used.

Other solutions allow the frequency modulation of the laser source to be measured. The simplest solution is based on the use of an interferometer that is "unambiguous" in the vicinity of the phase quadrature, such as for example a Mach-Zehnder interferometer with a very short delay or an optical resonator of large free spectral range. An example of a system of this type, equipped with a Fabry-Perot resonator is shown in FIG. 1b. It comprises:
- a laser source 1, with a controller 11 of a modulation voltage corresponding to a frequency setpoint $f_0(t)$, equipped with a unit 111 for storing digital setpoints and a converter 112 for converting these digital setpoints into analog signals $f_0(t)$;
- a coupler 12 that samples some of the light emitted in order to send it to an interferometer 2;
- a Fabry-Perot resonator 2;
- a photodiode 3 able to convert the light-intensity signal generated by the resonator 2 into an analog electrical signal;
- a device 4 for measuring the signals delivered by the photodiode 3, which includes a converter 41 for converting these analog signals into digital signals, and a unit 43 for storing, at preset times, the digital signals generated by the converter 41;
- a unit 5 for processing the stored signals, and for transmitting a set voltage to the controller 11; and
- a synchronizing device 6 between the storing unit 43 and the voltage controller 11.

In this case, the signal output from the interferometer or the resonator and measured by the photodiode may be written:

$$x(t) = A \cdot F(f(t))$$

where A is a proportionality factor depending on the injected power and F a function that is monotonic (and therefore invertible) over the possible range of excursion of the frequency $f(t) = f_{moy} + \Delta f(t)$ of the laser. For example, in the case of the short-delay interferometer, if the powers are perfectly balanced, we have:

$$x(t) \propto \cos(\varphi(t) - \varphi(t-\tau)) + 1 \approx \cos(2\pi \tau f(t)) + 1.$$

A necessary condition for the function to be invertible is for τ to be sufficiently small that |2πΔf(t)τ|<π.

Thus, this technique is unfortunately not suitable for applications in which a large modulation dynamic range and a high measurement precision are required simultaneously. In addition, the dependency of the proportionality factor A on power may decrease the precision with which the frequency may be measured. Lastly, drift in the system may lead to drift in the measurement (for example loss of the power balance between the two channels of the interferometer or any spectral shift in the response of the resonator).

A last solution consists in simultaneously measuring the phase component and quadrature component of the interferometric signal generated by a two-arm double interferometer. An example of this type of system with a Mach-Zehnder interferometer is shown in FIG. 1c. It comprises:
- a laser source 1, with a controller 11 of a modulation voltage corresponding to a frequency setpoint $f_0(t)$, which is equipped with a unit 111 for storing digital setpoints and a converter 112 for converting these digital setpoints into analog signals $f_0(t)$;
- a coupler 12 that samples some of the light emitted in order to send it to an interferometer 2;
- a two-arm Mach-Zehnder interferometer 2 with a coupler 23 for splitting, preferably into two equal portions, the light received by the coupler 12, and, in one arm, a delay line 21; in the other arm the light signal is split by a coupler 25 into:
  - a phase component that is then recombined using a coupler 241 with light that has passed through the other arm; and
  - a quadrature component obtained using an element 22, such as a quarter-wave plate, which is then recombined, using a coupler 242, with light that has passed through the other arm;
- a first photodiode 31 able to convert, into a first analog electrical signal, the light-intensity signal of a beat between the delayed signal and the phase component, which are generated by the interferometer;
- a second photodiode 32 able to convert, into a second analog electrical signal, the light-intensity signal of a beat between the delayed signal and the quadrature component, which are generated by the interferometer;
- a device 4 for measuring the signals delivered by the photodiodes 31, 32, which includes a converter 41 connected to the first diode 31, a converter 42 connected to the second diode 32, and a unit 43 for storing, at preset times, digital signals generated by the converters 41 and 42;
- a unit 5 for processing the stored signals, and transmitting a set voltage to the controller 11; and
- a synchronizing device 6 between the storing unit 43 and the voltage controller 11.

In this case, $x(t)=A\cdot\cos(\varphi(t)-\varphi(t-\tau))+B$ and $y(t)=C\cdot\sin(\varphi(t)-\varphi(t-\tau))+D$ are measured, where A, B, C, D are factors dependent on the injected power and the balance of the powers between the channels of the interferometers. Perfect knowledge of these factors allows the following to be measured:

$$z = \frac{x(t)-B}{A} + i\frac{y(t)-D}{C} = \exp(i\varphi(t) - i\varphi(t-\tau))$$

This technique is advantageous because it allows a good compromise between precision and dynamic range to be obtained using interferometers of high finesse (i.e. including a long delay). This technique makes it possible to avoid using any acousto-optical modulators. Nevertheless, it requires a time-invariant quarter wave plate. In addition, it requires the phase to be very precisely controlled, two signals to be acquired simultaneously and good knowledge of the factors A, B, C, D, which depend on incident power and on the balance of the powers of the channels, and which are thus liable to drift over time.

SUMMARY OF THE INVENTION

The aim of the invention is to mitigate these drawbacks. Specifically, there remains to this day a need for a method for measuring the frequency modulation of a laser source that simultaneously satisfies all of the aforementioned requirements in terms of providing a good compromise between precision and dynamic range, and in terms of the cost, bulk and reliability of the system used to implement the method.

According to the invention, the measurement of the frequency modulation of a laser source is also achieved using a two-arm interferometer (for example of Mach-Zehnder or Michelson type) one of the two arms of which is offset with a delay, but under the following operating conditions:
- the modulation signal is periodic; and
- the beat measurements are acquired over different modulation periods under distinct interference conditions based on a phase difference between the arms of the interferometer, which varies little on the scale of one frequency modulation period (typically a few hundred µs) but considerably on the scale of the repetition period of the measurement (a few s). This allows the phase component and quadrature component of the interferometric signal to be constructed virtually. The frequency modulation of the laser is then deduced therefrom.

More precisely, one subject of the invention is a method for measuring the frequency modulation f(t) of a laser source that comprises the following steps:
- modulating the laser source over a period T, with a modulation controller;
- in a given period T, carrying out a plurality of measurements of a beat light intensity between two arms of an interferometer located downstream of the laser source and able to introduce a delay τ between the two arms, these measurements being synchronized with the control of the modulation; and
- calculating the frequency f(t) from the measurements.

It is mainly characterized in that
- during each period T, f(t) varies but the delay τ is considered constant;
- the delay τ varies as a function of time over a plurality of periods T (in practice τ varies significantly with respect to λ/c typically >10% λ/c, but little relatively typically <1%, where c is the speed of light); and
- the measurements carried out at the time $t_i$ in a given period are reiterated at $t_i+kT$, with k≥1 and in that the delay T has varied from one iteration to the next.

This method allows the modulation frequency of a laser source to be measured with a good compromise between precision and dynamic range using a simple two-arm interferometer that does not include any acousto-optical modulators. This allows drawbacks associated with the use of this component (cost, bulk, reliability, etc.) to be avoided. Furthermore, the proposed solution is based on an analysis of a signal that may be low-frequency, thereby allowing certain constraints on the detection chain and processing of the signal, such as constraints on the sampler, to be relaxed.

The calculation preferably includes:

organizing reiterated measurements that are homologous from one period to the next in the form of vectors x(t), $0 \leq t \leq T$;

these vectors x(t) describing an elliptical cylinder, calculating the axis $w_0$ of the cylinder; and projecting, along the axis $w_0$, onto a determined plane, this projection being parameterized by an angle that is a function of f(t). In practice, this function is advantageously developed to the first order and the projection is then parameterized by an angle proportional to f(t).

The period T is typically about a few µs (from 5 µs to 1 ms), and the delay τ typically varies over a duration varying from one-hundred milliseconds to one minute (from 100 ms to 1 mn).

According to one variant of the invention, the variation as a function of time of the delay τ is stimulated by means of a piezoelectric device.

The invention may be used to calibrate the control signal in order to get as close as possible to a frequency modulation defined beforehand by the user. To this end, the invention also relates to a method for calibrating the frequency of the laser source of a lidar to a setpoint $f_0(t)$, which comprises the following steps:

modulating the frequency of the laser source by means of a preset periodic control voltage U(t);

defining a linear transformation between f(t) and U(t), which transformation may for example be obtained by measuring the transfer function of the frequency modulation, which is designated FTM;

calculating a first control voltage $U_1(t)$ from $f_0(t)$ and said linear transformation;

i=1 and iterating the following steps:

measuring the frequency $f_i(t)$ of the laser source as indicated above;

calculating the error $\Delta f_i(t) = f_i(t) - f_0(t)$ and a correcting control voltage from $\Delta f_i(t)$ and said linear transformation;

defining a new control voltage $U_{i+1}(t)$ from the preceding control voltage $U_i(t)$ and the correcting control voltage;

i=i+1.

The number of iterations is generally lower than 10.

Another subject of the invention is a computer program, said computer program comprising code instructions allowing the steps of the method such as described to be carried out when said program is executed on a computer.

The invention also relates to a system for measuring the frequency modulation f(t) of a laser source that comprises:

the laser source associated with a modulation controller;

a two-arm interferometer with a delay line in one of the arms;

a device for measuring beat signals generated by the interferometer;

a unit for processing the measured signals; and a synchronizing device that is connected to the modulation controller and to the processing unit;

characterized in that the processing unit is suitable for implementing the described method.

The interferometer is for example of Mach-Zehnder or Michelson type.

Advantageously, the interferometer does not include any acousto-optical modulators.

BRIEF DESCRIPTION OF THE DRAWINGS

Other features and advantages of the invention will become apparent on reading the following detailed description, which is given by way of nonlimiting example with reference to the appended drawings, in which:

FIG. 6 schematically shows an example of modulation errors obtained after i iterations.

Figure 1A:
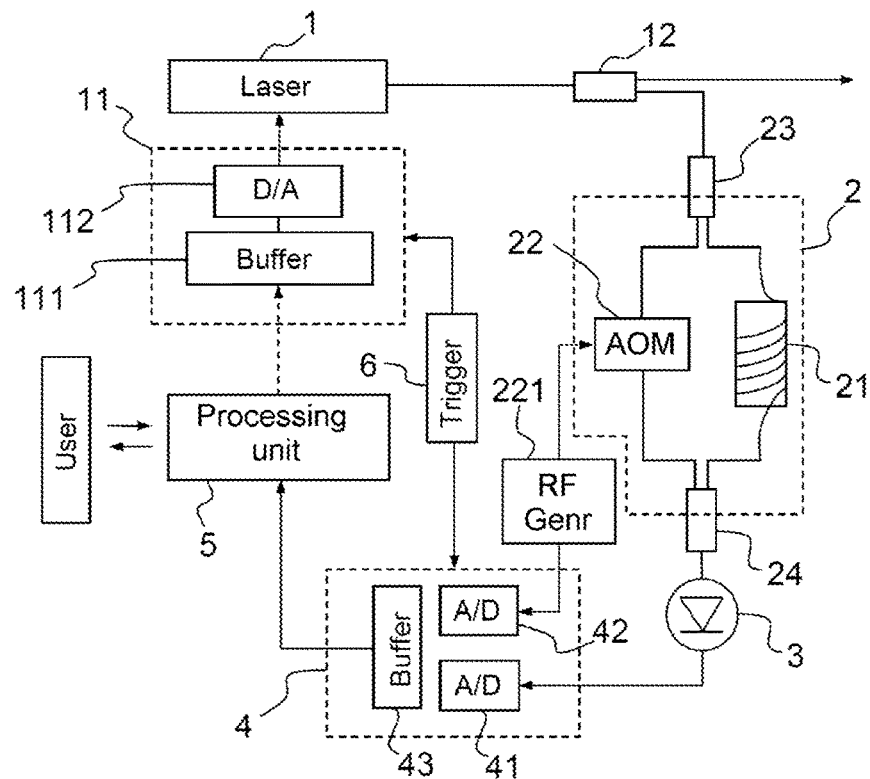
FIGS. 1a to 1c schematically show examples of systems for measuring the frequency modulation of a laser source according to the prior art, with a two-arm Mach-Zehnder interferometer equipped with an AOM (FIG. 1a), with an optical resonator (FIG. 1b), or with a two-arm interferometer able to measure the phase component and the quadrature component of the interferometric signal (FIG. 1c)
Figure 1B:
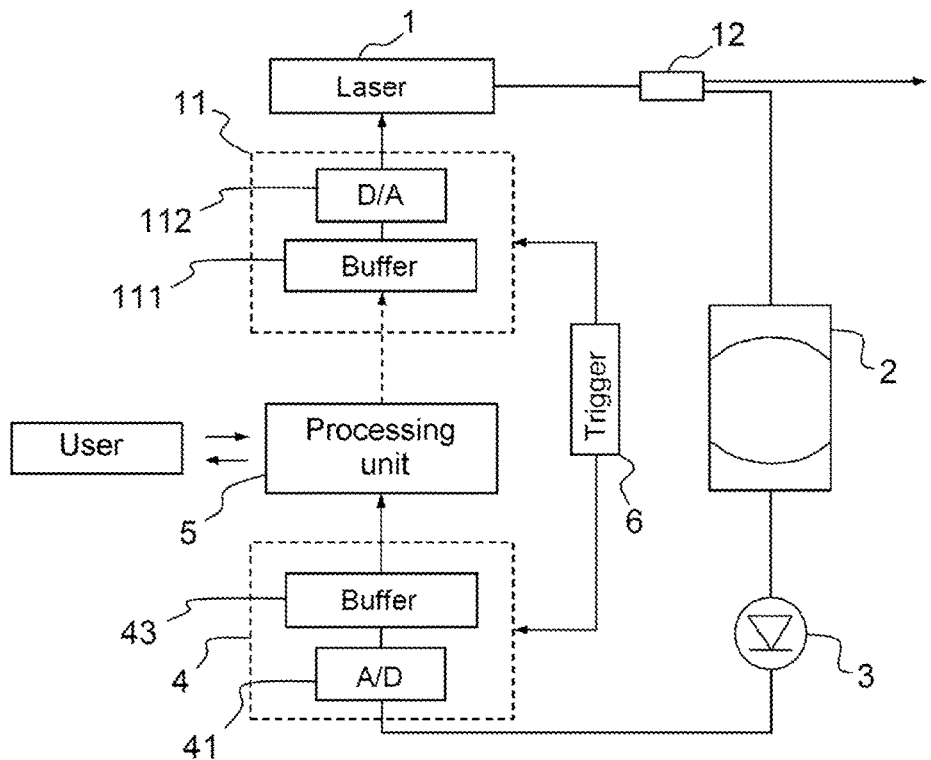
Figure 1C:
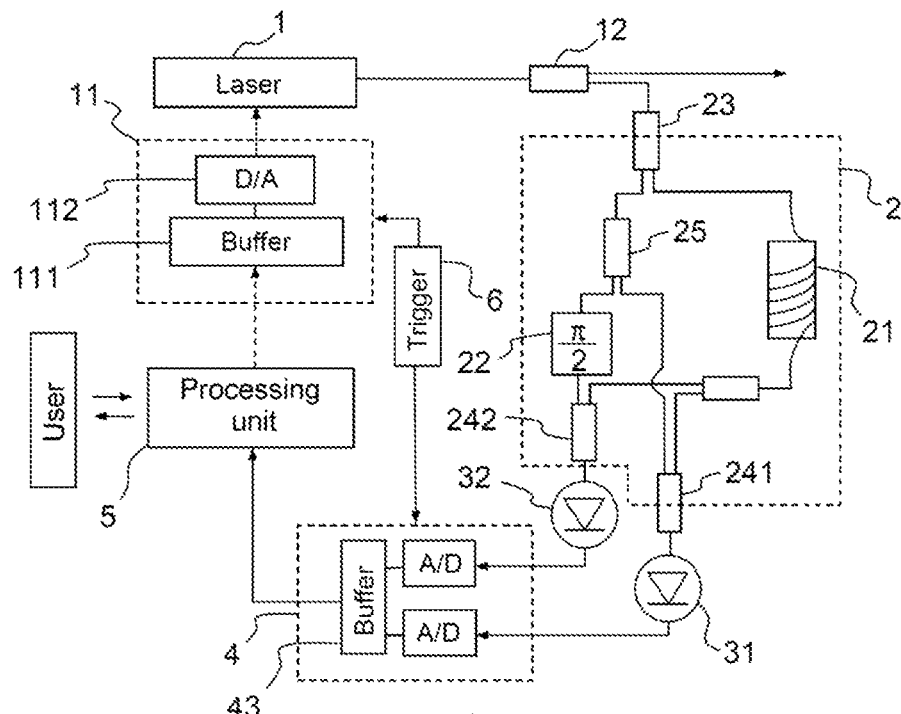

In all the figures, elements that are the same have been referenced with the same references.

DETAILED DESCRIPTION

A first example of a measuring system able to implement the method according to the invention will now be described with reference to FIG. 2a. It comprises:

a laser source 1, with a controller 11 of a modulation voltage corresponding to a frequency setpoint $f_0(t)$, which is equipped with a unit 111 for storing digital setpoints and a converter 112 for converting these digital setpoints into analog signals $f_0(t)$;

a coupler 12 that samples some of the light emitted in order to send it to an interferometer 2;

a two-arm Mach-Zehnder interferometer 2, with a delay line 21 in one of its arms, and two couplers, one 23 allowing splitting, preferably into two equal portions, and the other 24 allowing light that has passed through the two arms to be recombined;

a photodiode 3 able to convert the light-intensity signal generated by the interferometer 2 into an analog electrical signal;

a device 4 for measuring the signals delivered by the diode 3, which includes a converter 41 for converting these analog signals into digital signals, and a unit 43 for storing, at preset times, the digital signals generated by the converter 41;

a unit 5 for processing the stored signals and for transmitting a set voltage to the controller 11; and a synchronizing device 6 between the storing unit 43 and the voltage controller 11, which is also connected to the processing unit.

Another example of a measuring system able to implement the method according to the invention, in which the Mach-Zehnder interferometer of the preceding example is replaced by a Michelson interferometer, will now be described with reference to FIG. 2b. This system comprises:

a laser source 1, with a controller 11 of a modulation voltage corresponding to a frequency setpoint $f_0(t)$, which is equipped with a unit 111 for storing digital setpoints and a converter 112 for converting these digital setpoints into analog signals $f_0(t)$;

a coupler 12 that samples some of the light emitted in order to send it to an interferometer 2;

a two-arm Michelson interferometer 2 with a mirror 26, for example a Faraday mirror, at the end of each arm, a delay line 21 in one of its arms, and a coupler 23 allowing:

as it enters, light originating from the coupler 12 to be split, preferably into two equal portions; and as it exits, light that has passed through both arms to be recombined;

a photodiode 3 able to convert the light-intensity signal generated by the interferometer 2 into an analog electrical signal;

a device 4 for measuring the signals delivered by the diode 3, which includes a converter 41 for converting these analog signals into digital signals, and a unit 43 for storing, at preset times, the digital signals generated by the converter 41;

a unit 5 for processing the stored signals and for transmitting a set voltage to the controller 11; and a synchronizing device 6 between the storing unit 43 and the voltage controller 11, which is also connected to the processing unit.

All these configurations may be optical-fiber based.

Figure 2A:
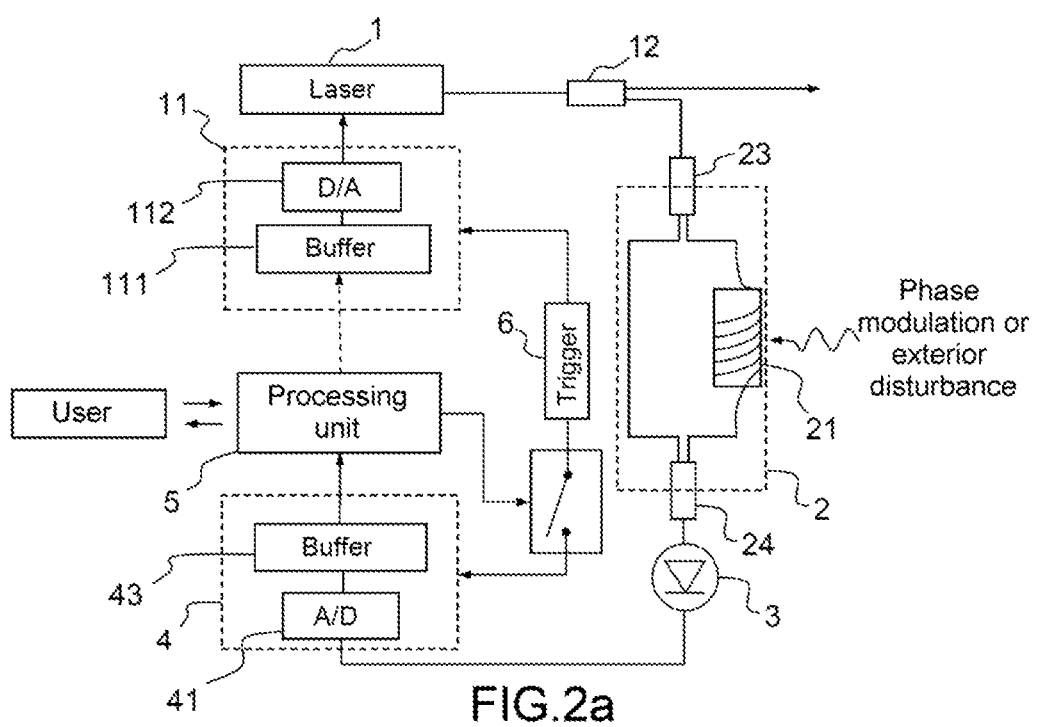
FIGS. 2a and 2b schematically show an example of a system for measuring the frequency modulation of a laser source able to implement the method according to the invention, using a Mach-Zehnder interferometer (FIG. 2a) or a Michelson interferometer (FIG. 2b)
Figure 2B:
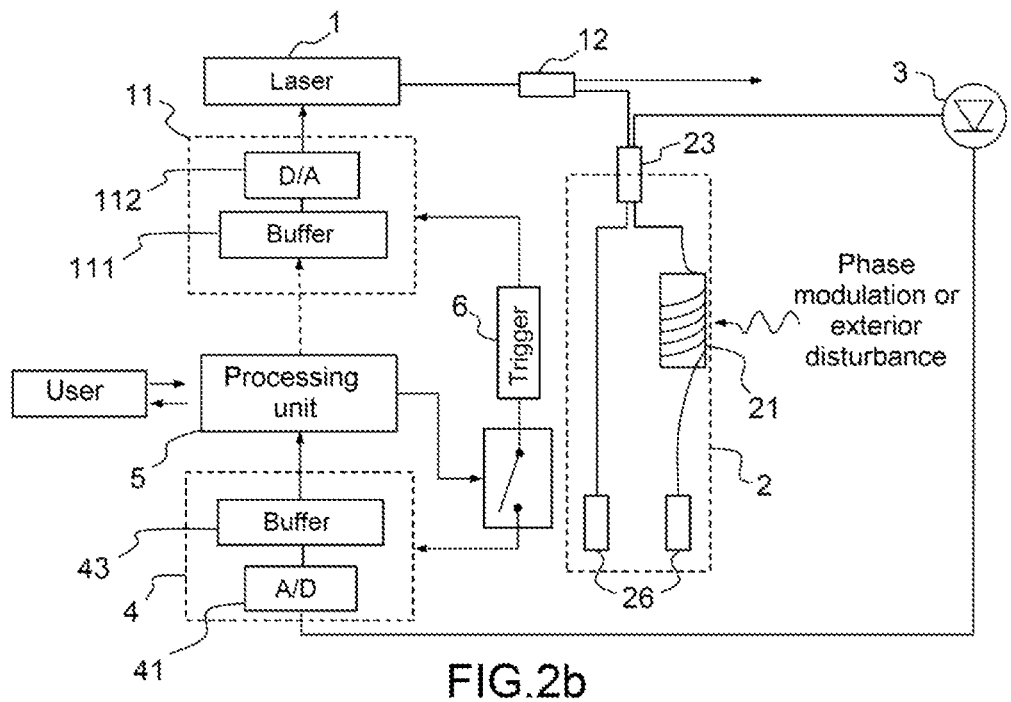

In the case of the system of FIG. 2b, by virtue of the mirrors 26, the level of the interference signal is constant even when optical fibers that are not polarization-maintaining are used.

In these two examples, some of the field of the laser 1 is injected into the interferometer 2, one of the arms of which is offset by a delay T by the delay line 21; the rest of the field is for example intended for a telemetry or anemometry application and, as may be seen in FIGS. 2a and 2b, takes no part in the method for modulating the source (the anemometry or telemetry signal is not used for the modulation of the source). The interference signal generated by the interferometer is then converted into an electrical signal using a photodiode 3, then converted into a digital signal by the converter 41 in order to be stored in a buffer memory (buffer) 43. A synchronizing device 6 is used to synchronize the acquisition of the signal by the memory 43 with the frequency-modulation setpoint of the controller 11. The acquisition of a plurality of modulation periods allows a processing unit 5 to reconstruct the frequency modulation frequency of the laser 1 using an original method.

The method according to the invention works if the various modulation periods have been acquired under distinct interference conditions. This may be achieved "naturally", for example because of thermal drift in the interferometer or drift in the wavelength of the laser. It may also be stimulated, for example if one of the two interferometer arms includes a system for modulating phase (by about π/2).

This phase modulation being low-frequency (typically lower than 10 Hz), it may be achieved simply via a piezoelectric effect or a thermal effect.

The frequency measurement according to the invention allows the AOM found in the examples of the prior art to be omitted. It is based on processing of the beat signal output from the interferometer 2. In this architecture, this beat signal may be written:

$$x(t)=\cos(\varphi(t)-\varphi(t-\tau)+\psi(t,\tau))$$

where the phase of the laser at the time t is written $$\varphi(t)+\psi(t)$$

in which expression $\varphi(t)$ expresses the phase variation associated with the frequency modulation and $\psi(t)$ contains all the terms associated with the average frequency and with the parasitic phase fluctuations (for example stemming from phase noise). $\psi(t,\tau)$ is a phase that depends on the variation in optical path between the arms of the interferometer 2 but that fluctuates little on the scale of the period of the frequency modulation. In practice τ varies significantly with respect to λ/c (typically Δτ>10% λ/c, where c is the speed of light and λ the wavelength of the source) but varies little relatively (typically less than 1% i.e. (Δτ/τ)<0.01, Δτ being the variation in T over a plurality of periods T).

Since the frequency f(t) of the laser is proportional to the derivative of the phase:

$$x(t)=\cos(\varphi(t)-\varphi(t-\tau)+\psi(t,\tau))$$

$$x(t)=\cos(2\pi\int_{t-\tau}^{t}f(u)du+\psi(t,\tau))$$

$$\approx \cos(2\pi\tau f(t)+\psi(t,\tau))$$

The developed processing aims to isolate the contribution of the frequency f(t) with respect to the phase fluctuations $\psi(t, \tau)$, i.e. to remove $\psi(t, \tau)$ to within a constant. This processing assumes that the modulation signal is periodic (of period T) and uses two timescales to measure the frequency f(t):

a short timescale during which f(t) varies and $\psi(t, \tau)$ is constant, i.e. typically a few μs;

a long timescale over which $\psi(t, \tau)$ has varied, i.e. typically a few seconds to a few minutes.

In practice, it is necessary to measure the signal $x_i(t)$ over m distinct periods with a long timescale covering a plurality of modulation periods, to obtain:

$$x_i(t)=x(t-k_iT) \text{ where } 1\leq i\leq m,\ k_i\in \mathbb{N},0\leq t<T.$$

The measurements of $x_i(t)$ at these times $k_iT$ are said to be homologous. The frequency emitted by the laser can be reconstructed only at the end of a plurality of measuring periods spaced apart by a longer timescale.

It is assumed that thermal and ageing effects are sufficiently small, or more generally that the interference conditions are sufficiently stable, for the phase shift $\psi(t,\tau)$ between the interferometer arms to remain constant over a modulation period T, i.e.:

$$\psi(t-k_iT,\tau)\approx cste=\psi_i \text{ for } 0<t<T$$

It is then possible to index the measured time vectors in the form:

$$x_i(t)=\cos(2\pi\tau f(t-k_iT)+\psi_i)=\cos(2\pi\tau f(t)+\psi_i)$$

and to consider the time-dependent vector: $x(t)=(x_1(t),\ldots,x_m(t))^T$, the symbol T in the exponent meaning the transpose.

Figure 3A:
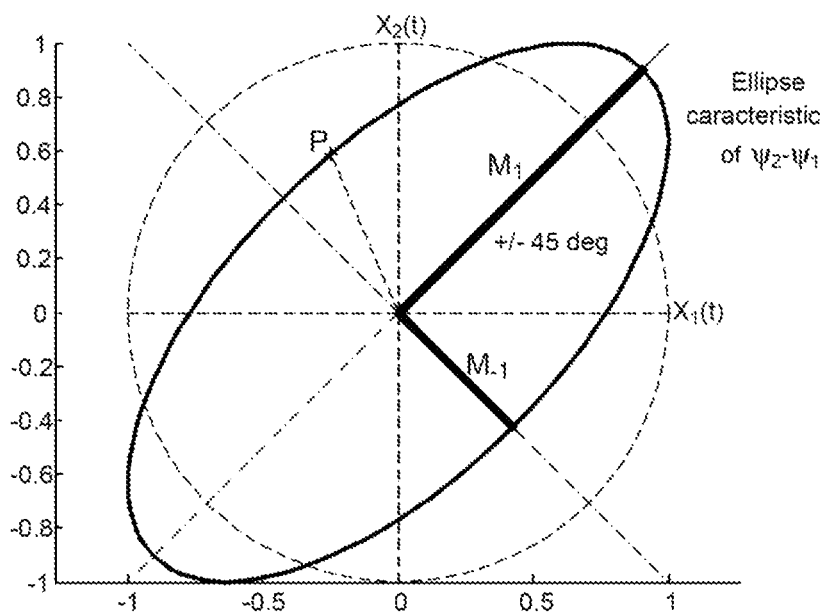
FIGS. 3a and 3b schematically show an example of the path of the vector representative of the measurements obtained over 2 periods with then an elliptical path (FIG. 3a) and the transformation of this path into a circle so as to directly obtain the frequency to within a constant (FIG. 3b)

In the two-dimensional case, the vector
$x(t)=(x_1(t),x_2(t))^T=(\cos(2\pi f(t)+\psi_1), \cos(2\pi f(t)+\psi_2))^T$
describes an ellipse if $\psi_1 \neq \psi_2$ as illustrated in FIG. 3a.

The coordinates of the point P are $(\cos(\alpha(t)+\psi_1), \cos(\alpha(t)+\psi_2))$. $\alpha$ can only be determined to within a constant. If a plurality of points $P(\alpha)$ are acquired an ellipse characterized by $$\psi_2-\psi_1$$

is described, but there is no immediate geometric construction allowing the ellipse of $\psi_1$ and $\psi_2$ to be deduced. In two dimensions, to determine $\alpha$ from all the points of the ellipse, one technique consists in transforming the ellipse into a circle so as to return to a natural definition (i.e. an angle) for $\alpha$. To do this, the following operations may be carried out:

Determining the eccentricity of the ellipse. To do this, on account of the fact that the axes of the ellipse are always at $+/-45°$, it is necessary to determine the maximum of the projections of the path of the point x (i.e. the ellipse) on the axes $(1, 1)$ and $(1, -1)$. The maximum on $(1, 1)$ is denoted $M_1$ and the maximum on $(1, -1)$ is denoted $M_{-1}$.

Performing a dilation of the axis $(1, 1)$ of parameter $1/M_1$ and of the axis $(1, -1)$ with a parameter $1/M_{-1}$ (for example by performing a rotation of $-45$ deg, followed by a dilation of the axes of the abscissae with a parameter $1/M_1$ and of the axis of the ordinates with a parameter $1/M_{-1}$ followed by a rotation of $+45$ deg.).

Figure 3B:
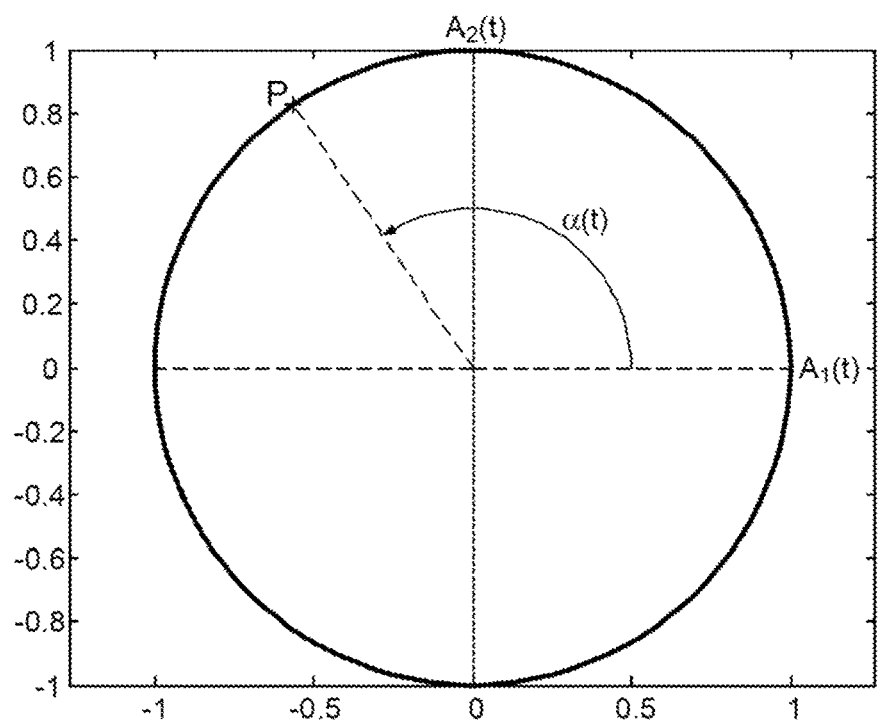

With these operations, which transform the axes x1 and x2 to A1 and A2, FIG. 3a transforms into FIG. 3b: $\alpha$ is then, to within a constant, directly the phase of the point along the circle.

In the same way, for a dimension m, $x(t)$ must describe an ellipse in a correctly chosen plane of $\mathbb{R}^m$. On this ellipse, the phase of the point x delivers directly:

$$\alpha(t)=2\pi f(t).$$

To determine the axis of the ellipse, the covariance matrix: $\Gamma=\langle x(t)x(t)^T\rangle$ is calculated then diagonalized in order to define the eigenvectors $v_i$ and the eigenvalues $\lambda_i$:

$$\Gamma v_i=\lambda_i v_i$$

$\lambda_1 \geq \lambda_2 \geq \ldots \geq \lambda_m \geq 0$: eigenvalues $(v_1, v_2, \ldots, v_m)$: orthonormal basis of $\mathbb{R}^m$ (eigenvectors).

In practice, only the 3 largest eigenvalues are non-negligible. Therefore, the projection of x in the sub-space formed by $(v1, v2, v3)$ is calculated, thereby allowing the dimensionality of the problem to be decreased. An example of an experimental result for the path $\{x(t), 0 \leq t \leq T\}$ of the vector $x(t)$ in this sub-space is presented in FIG. 3b: this path is obtained for m=400 periods of 200 μs measured over about 10 s with a sampling frequency of 125 MHz i.e. about 25000 points per period (a satisfactory result is obtained with 5000 points per period or more). Typically the period T is comprised between 10 to 800 μs and the delay T typically varies over a duration comprised between 1 s and 300 s. The points are organized into an elliptical cylinder of axis $w_0$. To determine the axis $w_0$, of the ellipse, it is sought to minimize a criterion $C(w)$ such as the variance of the norm relative to the square of the norm (the projection plane is chosen in order to obtain the most circular shape possible):

$$C(w) = \frac{(\|p_w(x)\|^4)}{(\|p_w(x)\|^2)^2} - 1$$

where $p_w(x)$ designates the projection of x along the axis w.

Figure 4A:
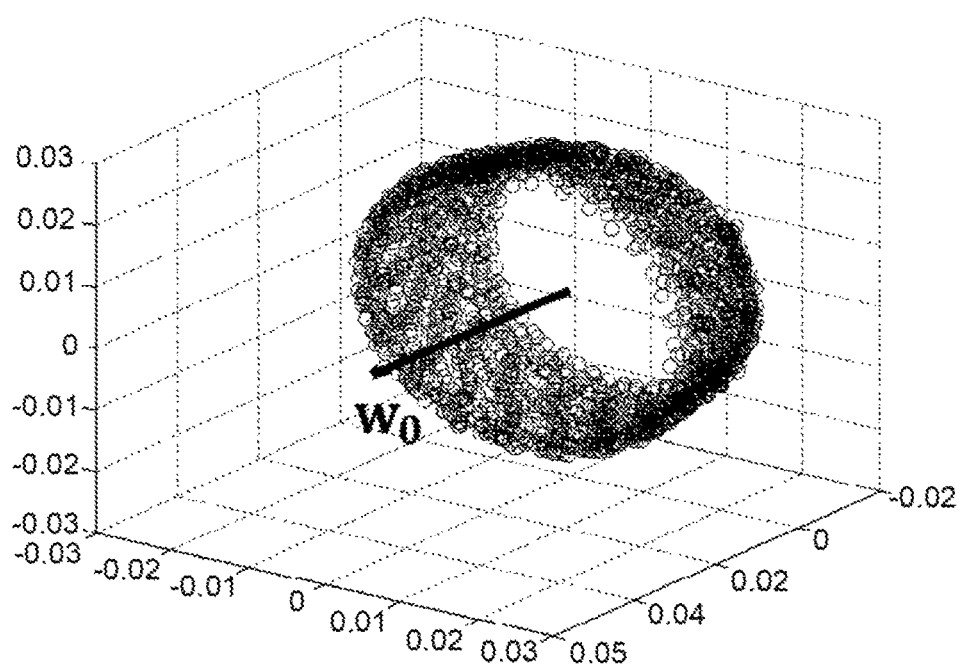
FIG. 4a schematically shows the projection into a three-dimensional space composed of three main components of an example path of the vector representative of the measurements obtained over 400 periods with then a cylindrical path of elliptical base, FIG. 4b schematically shows the path of FIG. 4a projected onto a plane that is almost perpendicular to the axis of the cylinder and normalized to a circle, and the corresponding frequency reconstruction is shown in FIG. 4c.

By projecting the points x along $w_0$, a slightly elliptical shape is obtained that, after re-normalization, as may be seen from FIG. 4a, allows:

$$\alpha(t) \cong 2\pi f(t),$$

and therefore the frequency over time as illustrated in FIG. 4b, to be deduced.

It has been possible to simultaneously evaluate various frequencies f(t) in this way, using this technique, for example by implementing a complex frequency f(t) comprising over a given period T a portion that is Constant Sinusoidal Parabolic Triangular.

A method for treating the signals $x_i(t)$ based on organization thereof in a vector form has been described. Other processing methods may be envisaged, such as, for example: an iterative linear regression; a simulated anneal; or recursive, genetic or Monte Carlo algorithms taking into account all of the measurements.

Figure 5:
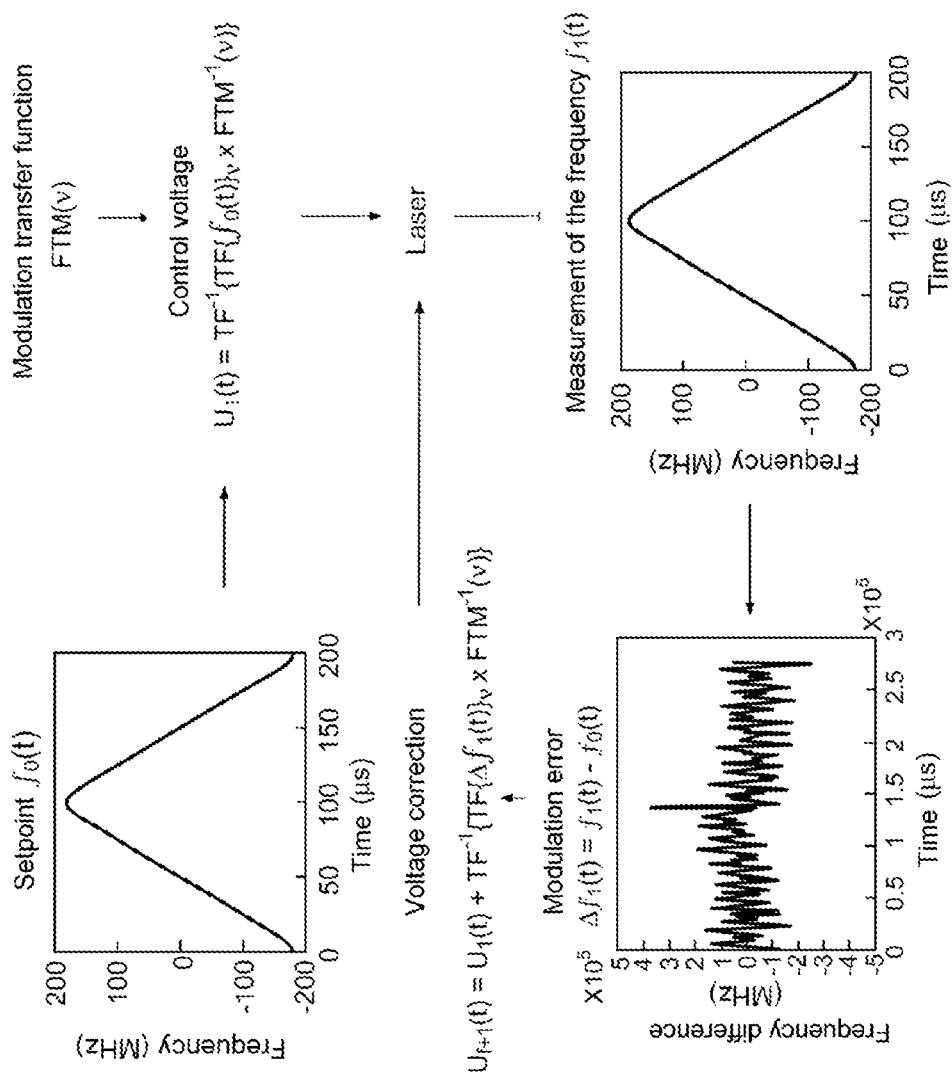
FIG. 5 illustrates various steps of a method for calibrating the frequency of a laser source according to the invention.

This method may in particular be used to calibrate the frequency of the laser source of a lidar to a setpoint $f_0(t)$, without using any AOMs. Such a procedure allows possible drifts in the transfer function of the laser (related to temperature, to the ageing of the diode, etc.) to be avoided. The main calibrating steps described with reference to FIG. 5 are carried out as follows.

A first step consists in defining a linear transformation between the control voltage and the frequency of the laser. This linear transformation may advantageously be obtained by measuring the transfer function of the frequency modulation. This is then done by using a known white noise (for example in a frequency band comprised between 0 and 150 kHz) as the control voltage of the modulation of the form $$H(t) = H_0 \sum_k \cos(2\pi k t / T + \phi_k)$$

where the $\varphi k$ are independent random phases, and by measuring the emitted frequency, using the method described above. The modulation transfer function is obtained with the relationship:

$$FTM(v) = \frac{TF\{f(t)\}_v}{TF\{U(t)\}_v}.$$

The calibrating process is then iterative in order to take into account the (experimentally observed) nonlinearity in this transfer function:

from the frequency setpoint, a first voltage to be applied to the laser diode is calculated using a linear transformation of this setpoint, for example using the modulation transfer function, such that:

$$U_1(t)=TF^{-1}\{TF\{f_0(t)\}_v \times FTM^{-1}(v)\};$$

the emitted frequency $f_1(t)$ is measured using the method described above;

the error in frequency with respect to the setpoint $\Delta f_i(t)=f_i(t)-f_0(t)$ is deduced from the preceding measurement;

this error allows a correction of the control voltage defined from $\Delta f_i(t)$ and the function defined above (for example the FTM) to be defined:

$$U_{i+1}(t)=U_i(t)-TF^{-1}\{TF\{\Delta f_i(t)\}_v \times FTM^{-1}(v)\};$$

the system repeats the preceding 3 points in order to refine the required control voltage and therefore the emitted frequency.

Two iterations generally allow a satisfactory result be obtained and, typically, 3 to 4 iterations are sufficient to achieve the minimal accessible error (i.e. about 1 minute) as illustrated in FIG. 6.

These calibrating and measuring methods allow the AOM found in the examples of the prior art to be omitted. However, use thereof is not excluded; specifically an AOM may optionally be added to one of the arms of the interferometer in order to avoid low-frequency noise.

The beat signal may be processed using hardware and/or software elements. This processing may be achieved using a computer-program product stored on a computer-readable medium, this computer program comprising code instructions allowing the steps of the reconstruction method to be carried out. The medium may be electronic, magnetic, optical, electromagnetic or be a storage medium employing infrared. Such media are for example semiconductor memories (random access memories (RAMs), read-only memories (ROMs)), tapes, floppy disks, hard disks or optical disks (compact disc-read-only memory (CD-ROM), compact disc-read/write (CD-R/W) and DVD).

Although the invention has been described with reference to particular embodiments, obviously it is in no way limited thereto and comprises any technical equivalent of the means described and combinations thereof if the latter fall within the scope of the invention.

The invention claimed is:

1. A method for measuring the modulation frequency $f(t)$ of a laser source, the method comprising the following steps:
    modulating the laser source over a period T, with a modulation controller;
    in a given period T, carrying out a plurality of measurements of a beat light intensity between two arms of an interferometer located downstream of the laser source and able to introduce a delay $\tau$ between the two arms, said measurements being synchronized with the control of the modulation; and
    calculating the frequency $f(t)$ from the plurality of measurements;
    wherein during each period T, $f(t)$ varies, and over a plurality of periods T, the delay $\tau$ varies as a function of time, with $\Delta\tau > 10\% \lambda/c$ and $\Delta\tau/\tau < 0.01\lambda/c$, where c is the speed of light and $\lambda$ the wavelength of the source; and
    wherein the plurality of measurements are carried out at the time $t_i$ in a given period and reiterated at $t_i+kT$, with $k \leq 1$ the delay $\tau$ having varied from one iteration to the next; and the frequency modulation is calculated from all of the reiterated measurements obtained under distinct interference conditions because of the variation in $\tau$.

2. The method for measuring the modulation frequency $f(t)$ of a laser source as claimed in claim 1, wherein the frequency modulation is calculated from a covariance matrix using a plurality of measurements.

3. The method for measuring the modulation frequency $f(t)$ of a laser source as claimed in claim 1, wherein the calculation includes:
    organizing reiterated measurements that are homologous from one period to the next in the form of vectors $x(t)$, $0 \leq t \leq T$;
    these vectors $x(t)$ describing an elliptical cylinder, calculating the axis $w_0$ of the cylinder; and
    projecting, along the axis $w_0$, onto a determined plane, this projection being parameterized by an angle that is a function of $f(t)$.

4. The method for measuring the modulation frequency $f(t)$ of a laser source as claimed in claim 3, wherein function of $f(t)$ of the angle is developed to the first order and in that the angle is proportional to $f(t)$.

5. The method for measuring the modulation frequency $f(t)$ of a laser source as claimed in claim 1, wherein the period T is a few μs, and the delay $\tau$ varies over a duration varying from a few seconds to a few minutes.

6. A method for calibrating the frequency of the laser source of a lidar to a setpoint $f_0(t)$, which comprises the following steps:
    modulating the frequency of the laser source by means of a preset periodic control voltage $U(t)$;
    defining a linear transformation between $f(t)$ and $U(t)$;
    calculating a first control voltage $U_1(t)$ from $f_0(t)$ and said linear transformation;
    i=1 and iterating the following steps:
        measuring the frequency $f_i(t)$ of the laser source as claimed in claim 1;
        calculating the error $\Delta f_i(t)=f_i(t)-f_0(t)$ and a correcting control voltage from $\Delta f_i(t)$ and said linear transformation;
        defining a new control voltage $U_{i+1}(t)$ from the preceding control voltage $U_i(t)$ and the correcting control voltage;
        i=i+1.

7. The calibrating method as claimed in claim 6, wherein the linear transformation between $f(t)$ and $U(t)$ is obtained by measuring the transfer function of the frequency modulation, which is designated the FTM.

8. The calibrating method as claimed in claim 6, wherein the number of iterations is lower than 10.

9. A computer program stored on a non-transitory computer-readable storage medium, comprising code instructions allowing the steps of the method as claimed in claim 1 to be carried out when said program is executed on a computer.

10. A system for measuring the frequency modulation $f(t)$ of a laser source that comprises:
    the laser source associated with a modulation controller;
    a two-arm interferometer with a delay line in one of the arms;
    a device for measuring beat signals generated by the interferometer;
    a unit for processing the measured signals; and
    a synchronizing device that is connected to the modulation controller and to the processing unit;
    wherein the processing unit is suitable for implementing the method as claimed in claim 1.

11. The system for measuring frequency modulation as claimed in claim 10, wherein the interferometer is of Mach-Zehnder or Michelson type.

12. The system for measuring frequency modulation as claimed in claim 10, wherein the interferometer does not include any acousto-optical modulators.

13. The method for measuring the modulation frequency $f(t)$ of a laser source as claimed in claim 1, wherein the variation as a function of time of the delay $\tau$ is stimulated by means of a piezoelectric device.

* * * * *

UNITED STATES PATENT AND TRADEMARK OFFICE
CERTIFICATE OF CORRECTION

PATENT NO. : 10,317,288 B2
APPLICATION NO. : 15/561057
DATED : June 11, 2019
INVENTOR(S) : Jean Minet et al.

Page 1 of 1

It is certified that error appears in the above-identified patent and that said Letters Patent is hereby corrected as shown below:

In the Claims

In Claim 1, Column 11, Line 51, "with $k \leq 1$" should be -- with $k \geq 1$ --.

Signed and Sealed this
Twenty-seventh Day of August, 2019

Andrei Iancu
*Director of the United States Patent and Trademark Office*